(12) United States Patent
Pinola

(10) Patent No.: US 6,552,558 B1
(45) Date of Patent: Apr. 22, 2003

(54) TESTING FASTENINGS OF PRINTED CIRCUIT BOARD

(75) Inventor: Timo Pinola, Oulu (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/913,969

(22) PCT Filed: Feb. 21, 2000

(86) PCT No.: PCT/FI00/00133

§ 371 (c)(1),
(2), (4) Date: Feb. 22, 1999

(87) PCT Pub. No.: WO00/50909

PCT Pub. Date: Aug. 3, 2000

(30) Foreign Application Priority Data

Feb. 22, 1999 (FI) .................................................. 990375

(51) Int. Cl.[7] .............................................. G01R 31/02
(52) U.S. Cl. ......................................... 324/756; 439/83
(58) Field of Search ................................ 324/537, 538, 324/754, 756, 757; 439/68, 78, 83

(56) References Cited

U.S. PATENT DOCUMENTS 4,707,657 A * 11/1987 Boegh-Petersen ....... 324/158 F
5,801,536 A    9/1998 Brambilla et al.
6,117,693 A * 9/2000 Fogal et al. .................. 438/14

FOREIGN PATENT DOCUMENTS

| DE | 195 06 720 | 9/1996 |
| EP | 0 693 784 | 1/1996 |
| EP | 0 747 930 | 12/1996 |
| JP | 06181400 | 6/1994 |
| JP | 09102665 | 4/1997 |

OTHER PUBLICATIONS

International Search Report for PCT/FI00/00133.

* cited by examiner

*Primary Examiner*—Christine Oda
*Assistant Examiner*—Etienne P LeRoux
(74) *Attorney, Agent, or Firm*—Squire, Sanders & Dempsey LLP

(57) ABSTRACT

The invention relates to a method comprising supplying a test signal to a first pad part of the pad; measuring the occurrence of the test signal through a second pad part of the pad or a part of the printed circuit board connected to the second pad part, which second pad part is separate from the first pad part, and the leg of the connector is fastened both to the first pad part and to the second pad part during the manufacturing process in order to establish a connection between the pad parts through the leg. The invention further relates to a printed circuit board.

45 Claims, 5 Drawing Sheets

TESTING FASTENINGS OF PRINTED CIRCUIT BOARD

FIELD OF THE INVENTION

The invention relates to a method of testing the fastening of a connector to a printed circuit board.

BACKGROUND OF THE INVENTION

Typically, a connector is fastened to a printed circuit board by soldering the connector by its legs onto pads located on the printed circuit board. Typically, connectors are tested by inserting the counterpart of a connector into an automatic testing processor for a short period of time, which has presented the problems that the fastenings of the legs of the connector to the pads on printed circuit board have come off and connectors have broken; the problems have further resulted in poor gain in the manufacturing process and large additional costs. Another way to test the connectors is a method in which test signals are supplied from a testing device to the printed circuit board by test pins. Also in this method, the fastenings of the legs of the connectors to the pads remain untested. Since it has been impossible to ensure the fastenings of the legs of the connectors to the pads of the printed circuit board in the testing, defective fastenings considerably reduce the gain of the printed circuit boards.

BRIEF DESCRIPTION OF THE INVENTION

An object of the invention is thus to provide a method and a printed circuit board implementing the method so as to enable the above-mentioned problems to be solved. This is achieved by the following method of testing the fastening of a connector fastened by its leg to a pad of a printed circuit board. The method comprises supplying a test signal to a first pad part of the pad; measuring the occurrence of the test signal through a second pad part of the pad or a part of the printed circuit board connected to the second pad part, which second pad part is separate from the first pad part, and the leg of the connector is fastened both to the first pad part and to the second pad part during the manufacturing process in order to establish a connection between the pad parts through the leg.

The invention further relates to a method of testing the fastening of a component fastened by its leg to a pad of a printed circuit board. The method comprises supplying a test signal to a first pad part of the pad, measuring the occurrence of the test signal through a second pad part of the pad or a part of the printed circuit board connected to the second pad part, which second pad part is separate from the first pad part, and the leg of the component is fastened both to the first pad part and to the second pad part during the manufacturing process in order to establish a connection between the pad parts through the leg.

The invention further relates to a printed circuit board comprising: at least one pad connectable to a test device; at least one connector comprising at least one leg fastened to the pad. The pad comprises at least two separate pad parts, i.e. a first and a second pad part, and a test device is connectable to at least one pad part, and the leg of the connector is fastened both to the first pad part and to the second pad part in order to establish a connection between the pad parts through the leg.

The invention further relates to a printed circuit board comprising: at least one pad connectable to a test device; at least one component comprising at least one leg fastened to the pad. The pad comprises at least two separate pad parts, i.e. a first and a second pad part, and the test device is connectable to at least one pad part, and the leg of the component is fastened both to the first pad part and to the second pad part in order to establish a connection between the pad parts through the leg.

Preferred embodiments of the invention are disclosed in the dependent claims.

The idea underlying the invention is that while the leg of the connector fastens to at least two separate parts of the pad, the leg establishes a connection between the pad parts in question. A signal enabled by the connection is measured through a second pad part or a part of the printed circuit board connected to the second pad part, whereby it is ensured that the leg is securely fastened to the pad parts; if the leg of the connector is unsuccessfully fastened to at least one pad part, no connection exists between the pad parts, and thus, no signal to be measured to indicate the connection either. In other words, it then becomes apparent that the leg of the connector has come off one pad part, possibly both pad parts.

Several advantages are achieved by the method and printed circuit board of the invention. The invention enables the fastenings of the legs of connectors to the printed circuit board to be tested. This considerably improves the gain of the manufacturing process of printed circuit boards, in other words, the invention enables large costs to be saved.

BRIEF DESCRIPTION OF THE DRAWINGS

The invention is now described in greater detail in connection with the preferred embodiments and with reference to the accompanying drawings, in which.

DETAILED DESCRIPTION OF THE INVENTION

Figure 1A:
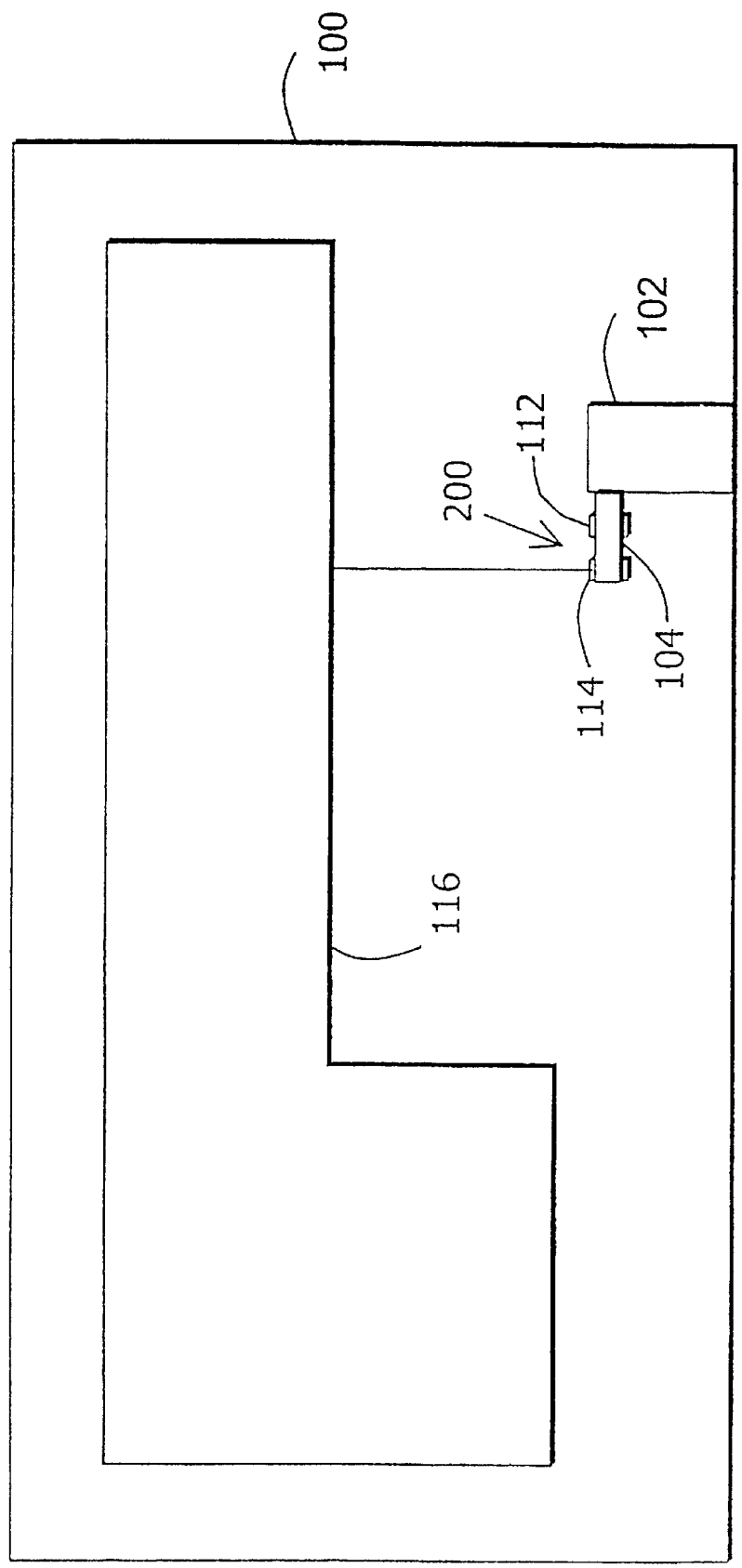
FIG. 1A is a top view of a printed circuit board and the testing environment thereof.
Figure 1B:
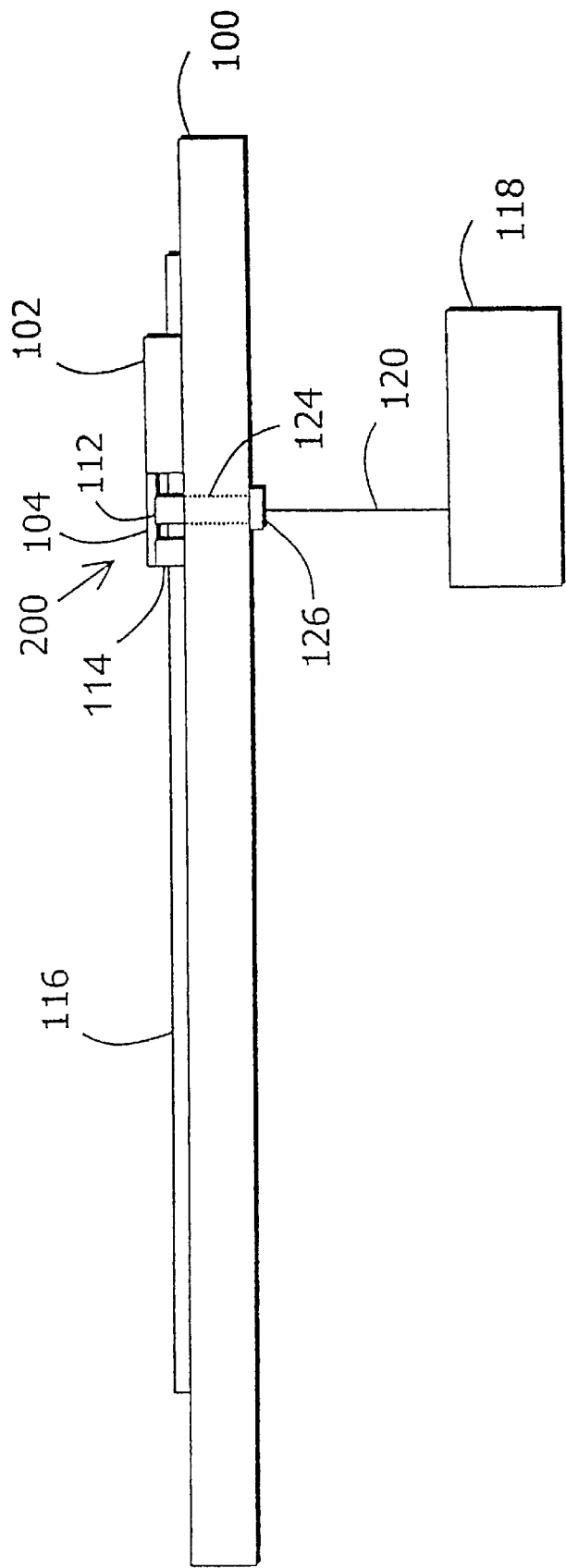
FIG. 1B is a side view of the printed circuit board and the testing environment thereof.

FIG. 1A is a top view of a printed circuit board 100 and the testing environment thereof. A connector 102 is fastened by its legs 104 to pad parts 112, 114 located on the printed circuit board 100. The pads, which are known to be one-piece, are thus divided into two separate parts 112, 114 in the present invention. The printed circuit board 100 comprises a circuitry 116 located on the printed circuit board, the circuitry 116 being connected to a second pad part 114. A test device 118 as seen in FIG. 1B is connectable to different parts of the printed circuit board 100, to the pad parts 112, 114, for example, by e.g. a test pin 120 in order to convey signals to the printed circuit board 100 or to measure signals from the printed circuit board 100, or both, in which case there are two test pins. The printed circuit board 100 is a base station card, for example, and the fastenings on the printed circuit board 100 are most often carried out by soldering.

FIG. 1B is a side view of the printed circuit board and the testing environment thereof. In addition to the subject matter disclosed in FIG. 1A, FIG. 1B comprises an inlet 124 provided on the printed circuit board, through which inlet a test pad 126 is fastened to a first pad part 112. Through the test pad 126, it is possible to measure what kind of signal occurs on the first pad part 112, or to supply a signal of the desired kind to the first pad part 112. These functions can be carried out by the test device 118 and the test pin 120.

Figure 2:
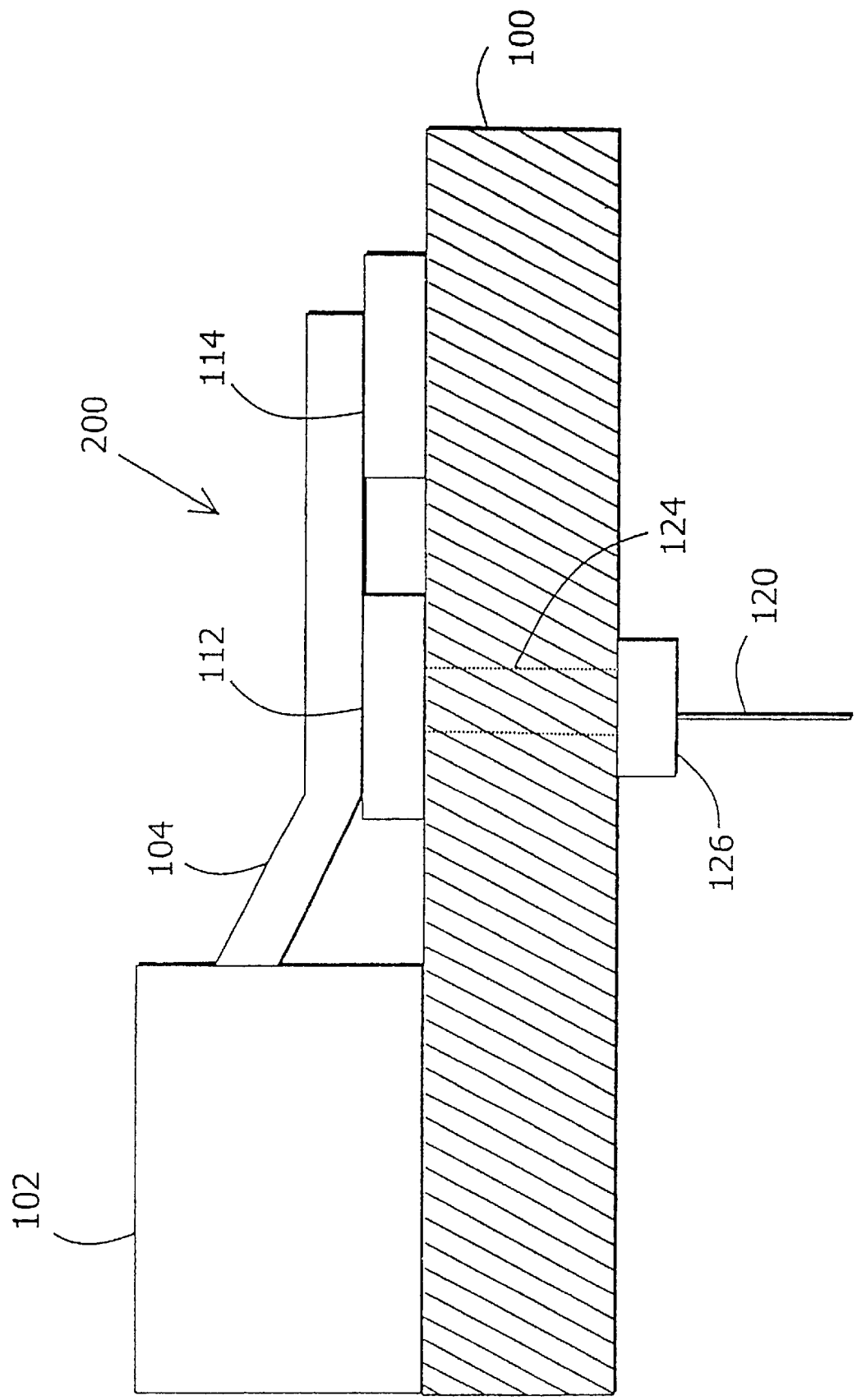
FIG. 2 shows a solution of the invention for fastening a connector to the printed circuit board.

FIG. 2 shows a solution of the invention for fastening the connector 102 to the printed circuit board 100. The distance between the pad parts 112, 114 is 0.03 mm to 10 mm. The distance between the pad parts 112, 114 is preferably 0.25 mm to 0.3 mm. The distance between the pad parts 112, 114 is preferably 0.1 mm to 0.3 mm. The leg 104 of the connector is fastened to both pad parts 112, 114, so the leg 104 of the connector establishes a connection between the pad parts 112, 114.

Figure 3:
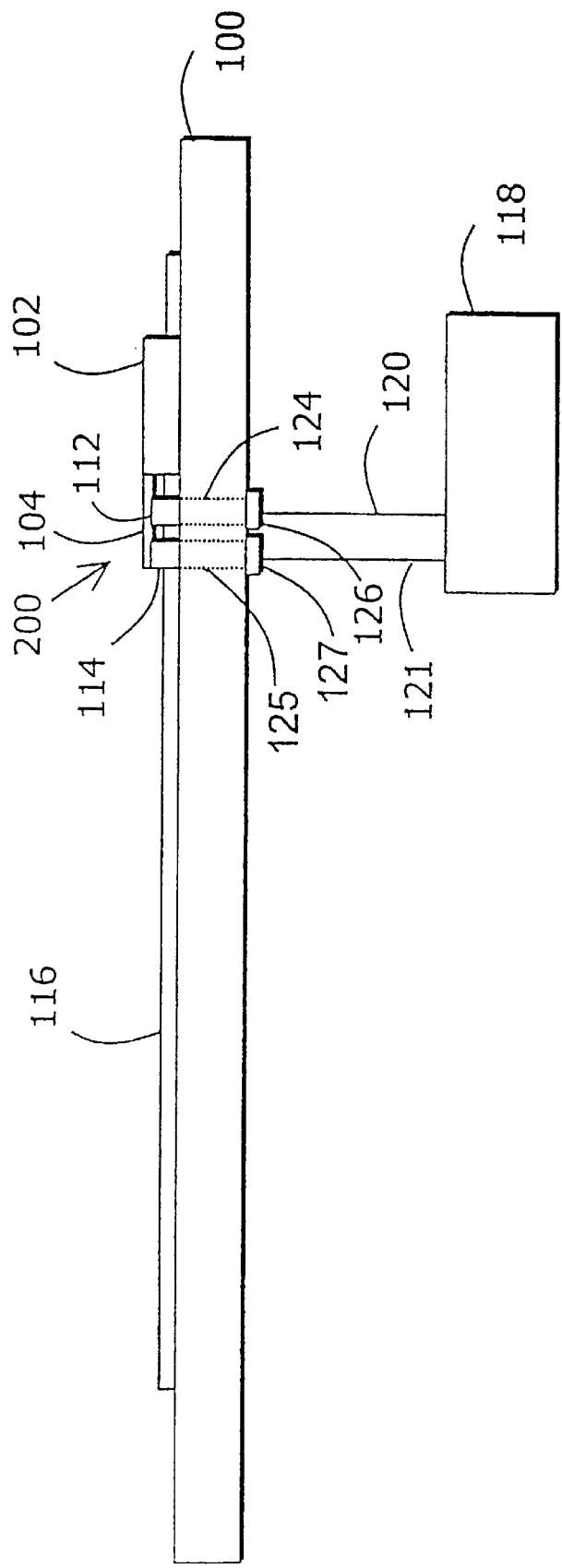
FIG. 3 shows a first preferred embodiment of the invention.

FIG. 3 shows a first preferred embodiment of the invention, comprising a printed circuit board 100 comprising at least one pad 200 connectable to a test device 118, and at least one connector 102 comprising at least one leg 104 fastened to the pad 200. The pad 200 comprises at least two separate pad parts 112, 114, i.e. a first 112 and a second 114 pad part, and the test device 118 is connectable to at least one pad part. The leg 104 of the connector is fastened both to the first pad part 112 and to the second pad part 114 in order to establish a connection between the pad parts 112, 114 through the leg 104. The distance between the pad parts 112, 114 is preferably 0.25 mm to 0.3 mm. In the present preferred embodiment of the invention, the first 112 and the second 114 pad part are determined in such a manner that the first pad part 112 is the pad part 112 whereto the leg 104 of the connector is fastened first as seen from the connector 102 along the leg 104 of the connector, and the second pad part 114 is the pad part 114 whereto the leg 104 of the connector is fastened second as seen from the connector 102 along the leg 104 of the connector. The second pad part 114 is connected to a circuitry 116 located on the printed circuit board 100. A test pad 126 is connected to the first pad part 112 in order to convey a test signal from the test device 118 to the first pad part 112. The test pad 126 is fastened to the first pad part 112 through an inlet 124 provided on the printed circuit board 100. The test device 118 is an automatic testing processor, for example.

The method according to the first preferred embodiment of the invention, shown by FIG. 3, comprises testing the fastening of the connector 102 fastened by its leg 104 to the pad 200 of the printed circuit board 100 by supplying a test signal to the first pad part 112 of the pad 200 and measuring the occurrence of the test signal through the second pad part 114 of the pad 200 or a part of the printed circuit board connected to the second pad part, i.e. the circuitry 116, which second pad part 114 is separate from the first pad part 112, and the leg 104 of the connector is fastened both to the first pad part 112 and to the second pad part 114 during the manufacturing process in order to establish a connection between the pad parts 112, 114 through the leg 104. If a signal is detected in the measurement, the fastening of the leg 104 of the connector is considered to be successful. If no test signal is detected in the measurement, the fastening of the leg 104 of the connector is considered to be defective. The occurrence of the test signal is inferred from whether the strength of the test signal exceeds a predetermined threshold value. In the present preferred embodiment of the invention, the first 112 and the second 114 pad parts are determined in such a manner that the first pad part 112 is the pad part 112 whereto the leg 104 of the connector is fastened first as seen from the connector 102 along the leg 104 of the connector, and the second pad part 114 is the pad part 114 whereto the leg 104 of the connector is fastened second as seen from the connector 102 along the leg 104 of the connector. The second pad part 114 is connected to a circuitry 116 located on the printed circuit board 100. A test pad 126 is connected to the first pad part 112 in order to convey a test signal from the test device 118 to the first pad part 112. The test pad 126 is fastened to the first pad part 112 through an inlet 124 provided on the printed circuit board 100. The test signal is supplied from the test device 118 to the first pad part 112 through the test pad 126 by, for example, a test pin 120. Similarly, the occurrence of the test signal is measured for the test device 118 by a test pin 121 through the second pad part 114, a test pad 128 connected to the second pad part or a part of the printed circuit board connected to the second pad part, i.e. a circuitry 116.

Figure 4:
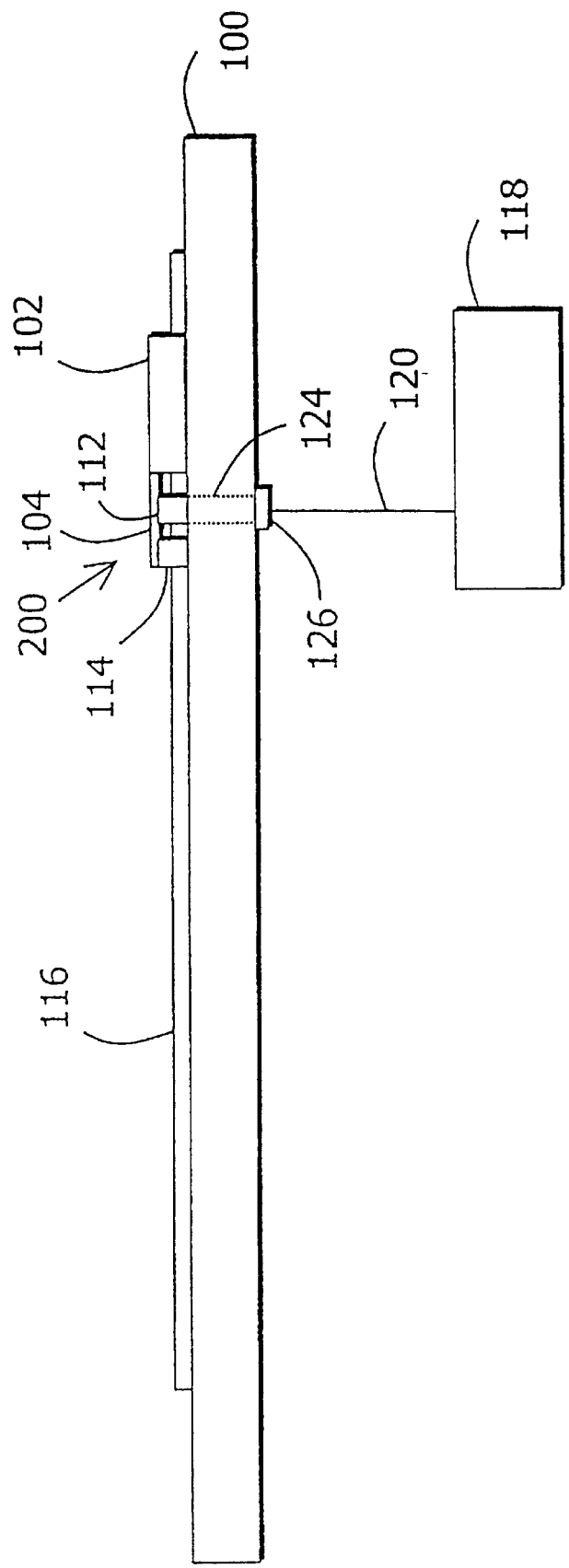
FIG. 4 shows a second preferred embodiment of the invention.

FIG. 4 shows a second preferred embodiment of the invention, which comprises a printed circuit board 100 which is an otherwise similar entity to the one shown in FIG. 3 in the first preferred embodiment except for the following points: the printed circuit board 100 comprises a second pad part 112, which is the pad part 112 whereto the leg 104 of the connector is fastened first as seen from the connector 102 along the leg 104 of the connector, and a first pad part 114, which is the pad part 114 whereto the leg 104 of the connector is fastened second as seen from the connector 102 along the leg 104 of the connector. The first pad part 114 is connected to a circuitry 116 located on the printed circuit board 100. The printed circuit board 100 comprises a test pad 126 fastened to the second pad part 112 through an inlet 124 provided on the printed circuit board 100 in order to measure the occurrence of a test signal from the second pad part 112 by a test device 118 and a test pin 120. It is possible to supply the test signal to the first pad part 114 or to the test pad connected thereto or to a circuitry 116 also elsewhere than from the test device 118, e.g. from the operating voltage of the circuitry 116.

The method according to the second preferred embodiment of the invention, shown by FIG. 4, comprises testing the fastening of the connector 102 fastened by its leg 104 to the pad 200 of the printed circuit board 100 in an otherwise similar manner except for the following points: the second pad part 112 is the pad part 112 whereto the leg 104 of the connector is fastened first as seen from the connector 102 along the leg 104 of the connector, and the first pad part 114 is the pad part 114 whereto the leg 104 of the connector is fastened second as seen from the connector 102 along the leg 104 of the connector. The first pad part 114 is connected to the circuitry 116 located on the printed circuit board 100. A test pad 126 is fastened to the second pad part 112 through an inlet 124 provided on the printed circuit board 100. The occurrence of a test signal is measured through the test pad 126 by a test device 118 and a test pin 120. It is possible to supply the test signal to the first pad part 114 or to the test pad connected thereto or to a circuitry 116 also elsewhere than from the test device 118, e.g. from the operating voltage of the circuitry 116.

The test signal can be anything from a voltage signal from a direct voltage signal to radio frequency voltage signals. When the radio frequency voltage signals are used, the fastenings of the leg 104 of the connector to the pad parts 112, 114 can be measured based on s-parameter measurements, which refers to measurements based on signal transmission or reflection, or both. In the situation shown by FIG. 3, the test device 118 transmits a radio frequency signal by the test pin 120 to the pad part 112. The fastenings are tested by measuring either the reflection back from the pad part 112 or the transmission through the pad part 114 along the test pin 121 to the test device 118. The transmission can also be measured from a point of the circuitry 116 located on the printed circuit board 100.

The number of the tests can be reduced by an application wherein a radio frequency signal is transmitted by the test pin 120 to the pad part 112 of the pad 200 and the measurement is carried out for the pad 200 in question from the pad part 114 of a parallel pad, which pad is not necessarily the adjacent parallel pad. The pads can be thought to form a filter structure. From the result obtained in the measuring point can be inferred whether the fastening of a pad part of the pad has come off. Hence, the fastenings of the pad parts of more than one pad can be tested by one measurement.

A component whose fastenings by its legs to the printed circuit board 100 are tested can be other than a connector 102, such as an IR transmitter or a short-distance radio transmitter, for example. Hence, the part 102 in the figures can be considered to represent the connector or another component.

Although the invention has been described above with reference to the examples according to the accompanying drawings, it is obvious that the invention is not restricted thereto but can be modified in many ways within the scope of the inventive idea disclosed in the attached claims.

What is claimed is:

1. A method of checking the fastening of a connector fastened by its leg to a pad of a printed circuit board, the pad comprising a first pad part and a second pad part separate from each other, the method comprising supplying a test signal to the first pad part of the pad, the leg of the connector being fastened during the manufacturing process both to the first pad part and to the second pad part in order for the test signal to pass along the leg of the connector from the first pad part to the second pad part, and measuring the occurrence of the test signal through the second pad part of the pad.

2. A method as claimed in claim 1, wherein if the occurrence of the test signal is detected in the measurement, the fastening of the leg of the connector is interpreted to be successful.

3. A method as claimed in claim 2, wherein the occurrence of the test signal is determined on the basis of whether or not the strength of the test signal exceeds a predetermined threshold value.

4. A method as claimed in claim 1, wherein if no occurrence of the test signal is detected in the measurement, the fastening of the leg of the connector is interpreted to be defective.

5. A method as claimed in claim 1, wherein the test signal is an RF signal, whereby the occurrence of the test signal is measured based on transparency and/or reflection of the test signal.

6. A method as claimed in claim 5, wherein it is found out on the basis of the occurrence of the test signal measured from the second pad part whether or not the fastening of one or more legs of the connector is defective.

7. A method as claimed in claim 1, wherein the occurrence of the test signal is measured through a part of the printed circuit board connected to the second pad part.

8. A method as claimed in claim 1, wherein the distance between the pad parts is 0.03 mm to 10 mm.

9. A method as claimed in claim 1, wherein the distance between the pad parts is preferably 0.25 mm to 0.3 mm.

10. A method as claimed in claim 1, wherein distance between the pad parts is preferably 0.1 mm to 0.3 mm.

11. A method as claimed in claim 1, wherein the first pad part is the pad part to which the leg of the connector is fastened first as seen from the connector along the leg of the connector, and the second pad part is the pad part to which the leg of the connector is fastened second as seen from the connector along the leg of the connector.

12. A method as claimed in claim 11, wherein the second pad part is connected to a circuitry located on the printed circuit board.

13. A method as claimed in claim 11, wherein a test pad is fastened to the first pad part.

14. A method as claimed in claim 13, wherein the connection between the first pad part and the test pad is implemented through an inlet in the printed circuit board (100).

15. A method as claimed in claim 13, wherein the test signal is supplied to the first pad part through the test pad.

16. A method as claimed in claim 1, wherein the second pad part is the pad part to which the leg of the connector is fastened first as seen from the connector along the leg of the connector, and the first pad part is the pad part to which the leg of the connector is fastened second as seen from the connector along the leg of the connector.

17. A method as claimed in claim 16, wherein the first pad part is connected to the circuitry located on the printed circuit board.

18. A method as claimed in claim 16, wherein the test pad is fastened to the second pad part.

19. A method as claimed in claim 18, wherein the connection between the second pad part and the test pad is implemented through the inlet in the printed circuit board.

20. A method as claimed in claim 18, wherein the occurrence of the test signal is measured through the test pad.

21. A method as claimed in claim 16, wherein the test signal is supplied to the first pad part from the operating voltage of the circuitry of the printed circuit board.

22. A method as claimed in claim 1, wherein the transfer of the test signal and the measurement of the occurrence of the test signal are carried out by a test device.

23. A method as claimed in claim 22, wherein the test device is an automatic testing processor.

24. A method as claimed in claim 1, wherein the fastenings are carried out by soldering.

25. A printed circuit board comprising:

at least one pad comprising a first pad part and a second pad part separate from each other;

at least one connector comprising at least one leg fastened to the pad; wherein the leg of the connector is fastened both to the first pad part and to the second pad part in order to establish a signal path for a test signal from the first pad part to the second pad part;

the first pad part is an input point of the test signal to which the test signal can be supplied; and the second pad part is a measuring point of the test signal from which the passing of the test signal along the leg of the connector from first pad part to the second pad part can be measured.

26. A printed circuit board as claimed in claim 25, wherein the test signal is a signal of a circuitry of the printed circuit board.

27. A printed circuit board as claimed in claim 25, wherein the test signal is a signal generated by a test device.

28. A printed circuit board as claimed in claim 25, wherein the distance between the pad parts is 0.03 mm to 10 mm.

29. A printed circuit board as claimed in claim 25, wherein the distance between the pad parts is preferably 0.25 mm to 0.3 mm.

30. A printed circuit board as claimed in claim 25, wherein distance between the pad parts is preferably 0.1 mm to 0.3 mm.

31. A printed circuit board as claimed in claim 25, comprising a part of the printed circuit board connected to the second pad part.

32. A printed circuit board as claimed in claim 25, comprising a first pad part, which is the pad part to which the leg of the connector is fastened first as seen from the connector along the leg of the connector, and a second pad part, which is the pad part to which the leg of the connector is fastened second as seen from the connector along the leg of the connector.

33. A printed circuit board as claimed in claim 32, wherein the second pad part is connected to a circuitry located on the printed circuit board.

34. A printed circuit board as claimed in claim 32, wherein the printed circuit board comprises a test pad fastened to the first pad part in order to transfer the test signal from the test device to the first pad part.

35. A printed circuit board as claimed in claim 34, wherein the printed circuit board comprises an inlet for implementing the fastening between the first pad part and the test pad to the printed circuit board through the inlet.

36. A printed circuit board as claimed in claim 25, wherein the printed circuit board (100) comprises a second pad part, which is the pad part to which the leg of the connector is fastened first as seen from the connector along the leg of the connector, and a first pad part, which is the pad part to which the leg of the connector is fastened second as seen from the connector along the leg of the connector.

37. A printed circuit board as claimed in claim 36, wherein the first pad part is connected to the circuitry located on the printed circuit board.

38. A printed circuit board as claimed in claim 37, wherein the circuitry of the printed circuit board comprises an operating voltage for transferring the test signal to the first pad part.

39. A printed circuit board as claimed in claim 36, wherein the printed circuit board comprises a test pad fastened to the second pad part for measuring the occurrence of the test signal from the second pad part.

40. A printed circuit board as claimed in claim 39, wherein the printed circuit board comprises an inlet for implementing the fastening between the second pad part and the test pad to the printed circuit board through the inlet.

41. A printed circuit board as claimed in claim 25, wherein the test device is connectable to the printed circuit board for transferring the test signal and for measuring the occurrence of the test signal.

42. A printed circuit board as claimed in claim 41, wherein the test device is an automatic testing processor.

43. A printed circuit board as claimed in claim 25, wherein the fastenings are carried out by soldering.

44. A method of checking the fastening of a component fastened by its leg to a pad of a printed circuit board, the pad comprising a first pad part and a second pad part separate from each other, the method comprising supplying a test signal to the first pad part of the pad, the leg of the component being fastened during the manufacturing process both to the first pad part and to the second pad part in order for the test signal to pass along the leg of the component from the first pad part to the second pad part, and measuring the occurrence of the test signal through the second pad part of the pad.

45. A printed circuit board comprising:

at least one pad comprising a first pad part and a second pad part separate from each other;

at least one component comprising at least one leg fastened to the pad; wherein the leg of the component is fastened both to the first pad part and to the second pad part in order to establish a signal path for a test signal from the first pad part to the second pad part;

the first pad part is an input point of the test signal to which the test signal can be supplied; and the second pad part is a measuring point of the test signal from which the passing of the test signal along the leg of the component from first pad part to the second pad part can be measured.

* * * * *

UNITED STATES PATENT AND TRADEMARK OFFICE
CERTIFICATE OF CORRECTION

PATENT NO. : 6,552,558 B1  Page 1 of 1
DATED : April 22, 2003
INVENTOR(S) : Timo Pinola It is certified that error appears in the above-identified patent and that said Letters Patent is hereby corrected as shown below:

Title page,
Item [87], PCT Pub. Date, please delete "Aug. 3, 2000" and replace it with
-- August 31, 2000 --.

Signed and Sealed this

Fourth Day of November, 2003

JAMES E. ROGAN
*Director of the United States Patent and Trademark Office*